United States Patent
Ishii et al.

(10) Patent No.: US 7,078,728 B2
(45) Date of Patent: Jul. 18, 2006

(54) SURFACE-MOUNTED LED AND LIGHT EMITTING DEVICE

(75) Inventors: Hirohiko Ishii, Yamanashi (JP); Sadato Imai, Yamanashi (JP)

(73) Assignee: Citizen Electronics Co., Ltd., Yamanashi (JP)

(*) Notice: Subject to any disclaimer, the term of this patent is extended or adjusted under 35 U.S.C. 154(b) by 91 days.

(21) Appl. No.: 10/899,120

(22) Filed: Jul. 27, 2004

(65) Prior Publication Data

US 2005/0023538 A1 Feb. 3, 2005

(30) Foreign Application Priority Data

Jul. 29, 2003 (JP) .............................. 2003-202747

(51) Int. Cl.
*H01L 27/15* (2006.01)
(52) U.S. Cl. .......................... 257/79; 438/22; 257/432; 257/80
(58) Field of Classification Search ................... 438/22, 438/82, 98, 106, 249; 257/79, 80, 432
See application file for complete search history.

(56) References Cited

U.S. PATENT DOCUMENTS 6,599,768 B1 * 7/2003 Chen ........................... 438/22

FOREIGN PATENT DOCUMENTS

JP 11-307820 11/1999
JP 2002-252373 9/2002

* cited by examiner

Primary Examiner—Mai-Huong Tran
(74) Attorney, Agent, or Firm—Browdy and Neimark, PLLC (57) ABSTRACT

A surface-mounted LED including a base having heat conductivity, an insulative wiring board fixed to the base and including a conductive pattern and a mounting hole, a light emitting element chip mounted on a mounting area exposed by the mounting hole of the wiring board, and a reflective frame having heat conductivity and fixed to the base and thermally coupled therewith, to surround the light emitting element chip, heat generation from the light emitting element chip being released through both the base and the reflective frame, or either one thereof.

10 Claims, 10 Drawing Sheets

SURFACE-MOUNTED LED AND LIGHT EMITTING DEVICE

CROSS REFERENCE TO THE RELATED APPLICATION

The application claims the priority benefit of Japanese Patent Application No.2003-202747, filed on Jul. 29, 2003, the entire descriptions of which are incorporated herein by reference.

BACKGROUND OF THE INVENTION

1. Field of the Invention

The present invention relates to a light emitting element on which a light emitting diode (hereinafter referred to as LED) is loaded and a light emitting device using the light emitting element, more specifically, to a surface-mounted LED improved to increase heat release efficiency and light emitting efficiency and also to a light emitting device using it.

2. Description of Related Art

Conventionally, an LED, which is a semi-conductor formed by a chemical compound is widely utilized as a light emitting element, with a characteristic of long operating life and miniaturization. Because an LED of semi-conductor of gallium-nitride system compound for emitting blue color is developed and manufactured, a field of application of the LED is extended to a color display, and the application field is increasingly extended to a small color back light for a mobile phone, a vehicle-mounted display, further, a light emitting device of high brightness and high output for illumination, and further high brightness and long operating life are required for the LED.

Recently, in particular, a great number of light emitting elements of surface-mounted types, using the LED are manufactured because of characteristics of miniaturization and well-suited to mass production. However, when these light emitting elements are used for high brightness and high output, measures for heat release problem. That is to say, because driving current and brightness are approximately in a proportional relationship to a constant operating range in the LED, it is necessary to increase the driving current in order to acquire a high brightness. However, if the driving current is increased, in proportion to this, power loss in the LED is increased, and most of energy is converted into heat. As a result, the LED is subjected to a high temperature.

Here, because if the temperature is lower, the light emitting efficiency or current-light conversion efficiency becomes higher as the characteristic of the LED, therefore, when the LED is subjected to a high temperature, there will be a problem of lower brightness.

Moreover, when the high-temperature LED continues to be operated, the operating life thereof becomes short, and further there is a possible that transparency of the resin for sealing the LED is decreased, because of change in color due to heat. Therefore, there is a critical problem of operating life and reliability when the LED is used for the high brightness and high output.

To solve the above-described problems, the measures for heat release of the light emitting element are indispensable, and therefore several light emitting elements having heat release means have been proposed. As one of them, a light emitting element in which a pair of conductive members made of a metal material having heat conductivity are fixed by an insulative member and an LED is mounted to straddle the pair of conductive members, is proposed (for reference, see Japanese Patent Laid-Open H 11-307820, claims, FIG. 7).

Hereinafter, a conventional light emitting element will be explained referring to FIG. 9.

Figure 9:
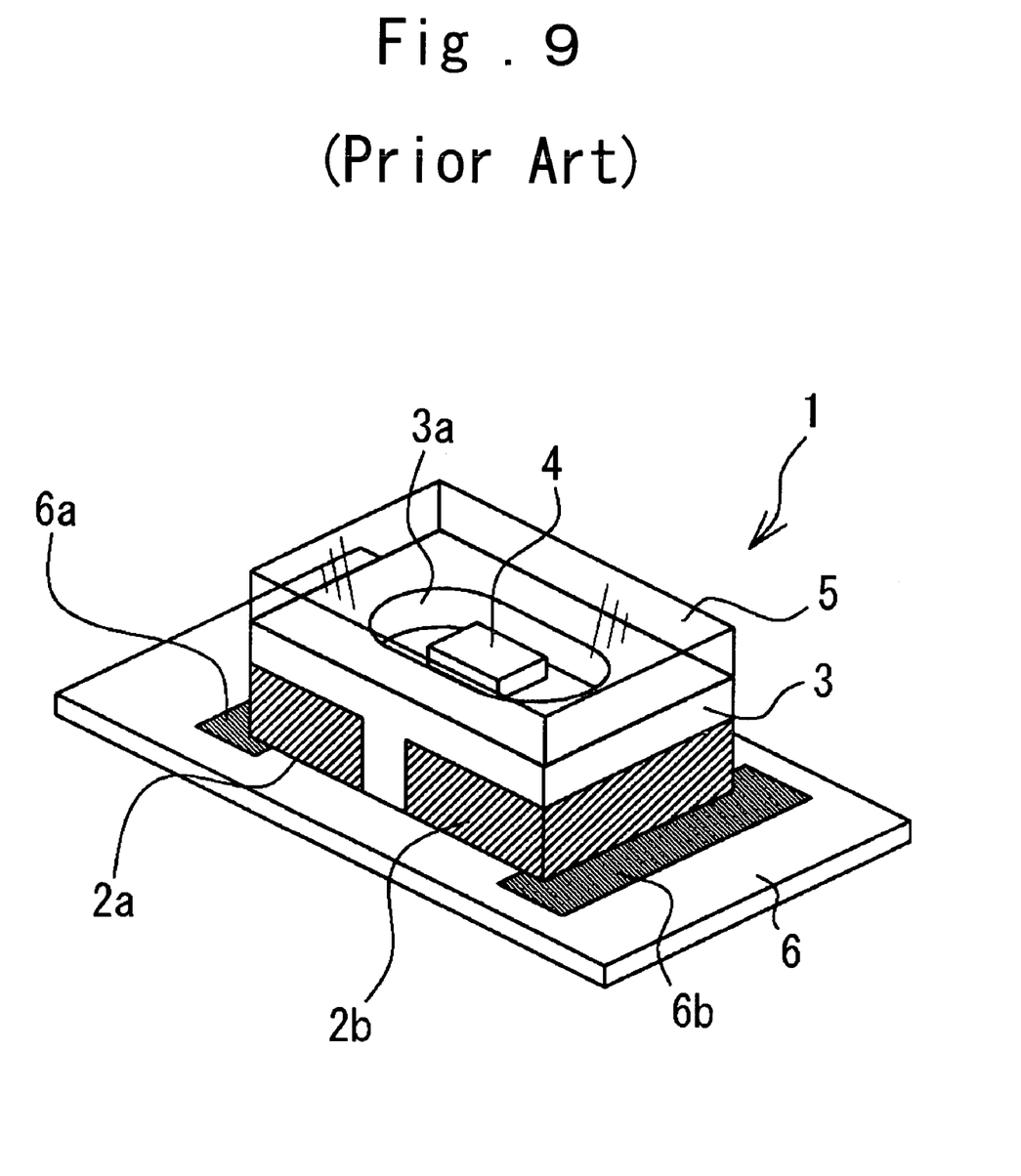
FIG. 9 is a perspective view showing a conventional surface-mounted light emitting element.

In FIG. 9, 1 is a conventional surface-mounted type light emitting element, 2a and 2b a pair of conductive members formed by a metal material having heat conductivity, 3 an insulative member for separating electrically and fixing the pair of conductive members 2a and 2b.

3a is a concave portion provided on an upper portion of the insulative member 3 so as to expose a portion of the conductive members 2a and 2b. is an LED chip which is mounted to straddle the pair of conductive members 2a and 2b exposed by the concave portion 3a of the insulative member 3, and is electrically connected and thermally coupled with the conductive members 2a and 2b. 5 is a transparent sealing member for sealing the LED chip 4. 6 is a printed-circuit board having conductive patterns 6a and 6b on which the light emitting element 1 is mounted.

Here, when a driving current is applied from the conductive patterns 6a and 6b to the LED chip 4, while the LED chip 4 emits light, simultaneously, the LED chip generates heat as a result of occurring power loss. The heat is transmitted efficiently to the conductive members 2a and 2b coupled thermally with the LED chip 4 and therefore if the printed-circuit board 6 is made of a material of excellent heat conductivity, it is possible to accomplish a good heat radiation effect.

There has been proposed another light emitting element having heat release means, in which a base for mounting an LED chip and lead frames as terminal electrodes are the same material together, the lowest surfaces of the base and lead frames are positioned at the generally same level and the base is mounted directly on the printed-circuit board (for reference, see Japanese Patent Laid-Open 2002-252373, Claims, FIG. 3).

Figure 10:
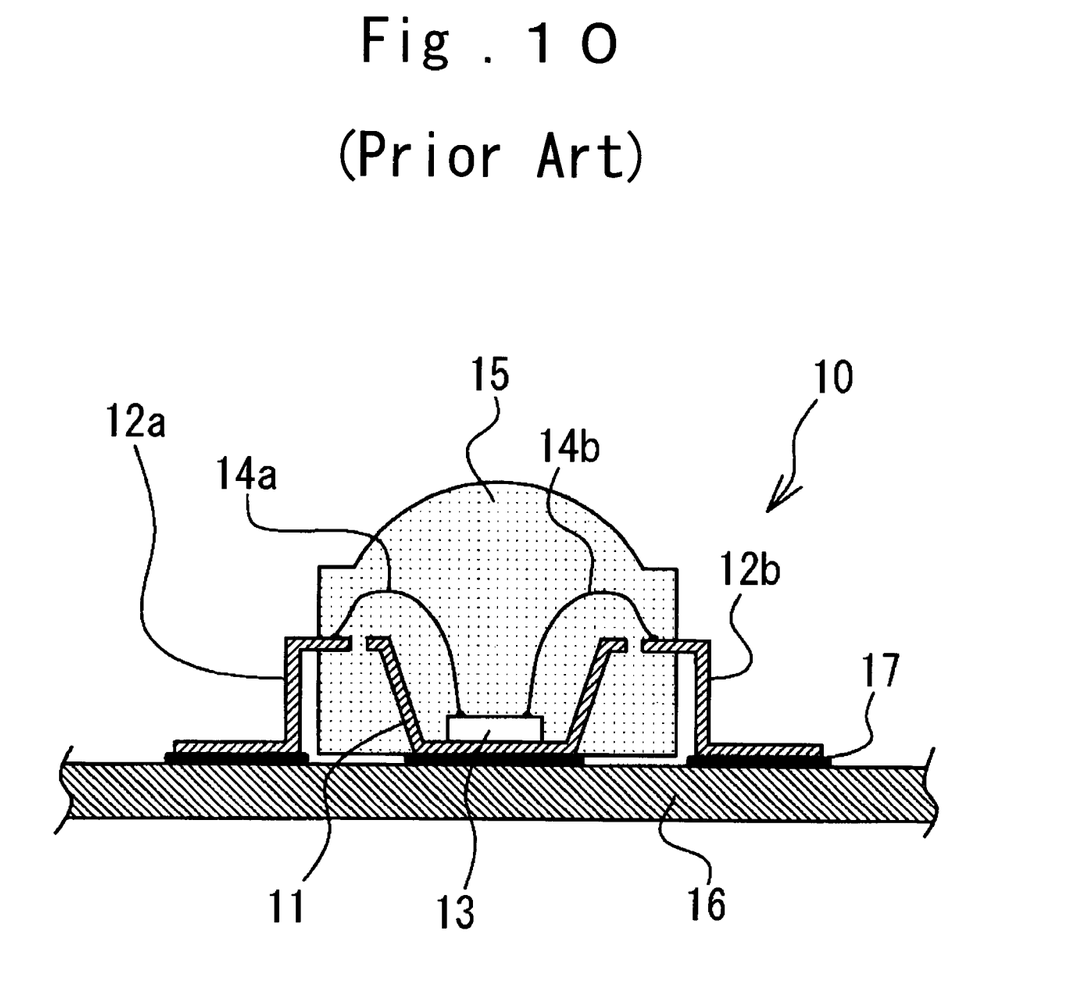
FIG. 10 is a sectional view showing a conventional light emitting element using lead frames.

Hereinafter, still another conventional light emitting element will be explained referring to FIG. 10. In FIG. 10, 10 is a conventional light emitting element, 11 a base, 12a and 12b lead frames. The base 11 and the lead frames 12a, 12b are made of the same material, the lowest surfaces of the base 11 and the lead frames 12a, 12b are positioned in the generally same level. 13 is an LED chip which is mounted on a bottom portion of the base 11 and coupled thermally with the base 11.

14a and 14b are wires comprising metal thin wires, which connect electrically an anode and a cathode of the LED chip 13 with the lead frames 12a and 12b. 15 is a transparent sealing member for sealing the base 11, the lead frames 12a, 12b, and the wires 14a, 14b together with the LED chip 13. 16 is a printed-circuit board on which the lead frames 12a, 12b are mounted through soldering 17. Here, because the lowest surface of the base 11 is positioned in the same level as that of the lead frames 12a, 12b, the base 11 is also fitted closely with the printed-circuit board 16 and fixed through the soldering 17, and the base 11 and the printed-circuit board 16 are thermally coupled.

Here, when a driving current is applied through the printed-circuit board 16 to the LED chip 13, the LED chip 13 which emits light simultaneously becomes high temperature by power loss. The heat is transmitted efficiently to the base 11 coupled thermally with the LED chip 13 and further because the base 11 is coupled thermally with the printed-circuit board 16, if the printed-circuit board 16 is made of a material of good heat conductivity, good heat release effect can be achieved. There has been made a proposal in which through-holes (not shown) by the conductive patterns are provided on the printed-circuit board 16 and a heat release member (not shown) is disposed on a back surface of the printed-circuit board 16 to transmit heat through the through-holes to the heat release member.

However, although good heat release effect can be expected to the light emitting element 1 shown in FIG. 9, if a metal core substrate or the like of good heat conductivity is used for the printed-circuit board 6, good heat release effect cannot be expected to a printed-circuit board of glass epoxy material or the like which is inexpensive.

In other words, heat conductivity of the glass epoxy material or the like is small to be a degree of few hundredth part of a copper alloy which is a material of the metal core substrate and therefore heat is not transmitted because of a large thermal resistance of the glass epoxy material or the like. Consequently, the utilization of the metal core substrate is indispensable in order to achieve good heat release effect, but the light emitting device is expensive because the material of the substrate is limited, and it is difficult for the metal core substrate to provide wirings in both surfaces thereof, and a high-density mounting is also difficult.

Furthermore, because the metal core substrate is made of a conductive material, the substrate must be insulated by provision of an insulative layer on a surface of the substrate, but because heat conductivity of the insulative layer is insufficient, sufficient heat release effect cannot be expected to the insulative layer. Because the insulative member 3 is formed by a material of low reflectivity, a force for collecting light by the concave portion is weak and therefore it is not possible to expect large increment of light emitting efficiency.

Moreover, in the light emitting element shown in FIG. 10, there is a problem similar to this. That is to say, because the base 11 is mounted in close relation with the printed-circuit board 16, heat-transmission from the base 11 to the printed-circuit board 16 is very effective, but because the printed-circuit board 16 is made of the glass epoxy material or the like, the heat conductivity is not effective, good heat release effect cannot be expected, further the metal core printed-circuit substrate is required. Moreover, because the structure, in which the heat release member is disposed on the back surface of the printed-circuit board 16, is formed by disposing the printed-circuit board 16 between the base 11 and the heat release member, the base 11 is not coupled thermally with the heat release member, and a structure of the trough-holes in the printed-circuit board 16 is also not effective to enhance heat connection between the base and the heat release member, and therefore significant improvement in heat release effect is not expected.

SUMMARY OF THE INVENTION

An object of the present invention is to provide a surface-mounted LED and a light emitting device using it, capable of increasing heat release efficiency through an improvement of heat structure and enhancing light emitting efficiency through a reflective structure, in order to resolve the above problems in the prior art.

To achieve the above object, a surface-mounted LED according to an aspect of the present invention comprises a base having heat conductivity, an insulative wiring board fixed to the base and including a conductive pattern and a mounting hole, a light emitting element chip mounted on a mounting area exposed by the mounting hole of the wiring board, and a reflective frame having heat conductivity and fixed to the base and thermally coupled thereto, to surround the light emitting element chip.

Heat generated from the light emitting element chip is released through both the base and the reflective frame, or either one thereof.

DETAILED DESCRIPTION OF THE PREFERRED EMBODIMENTS

Hereinafter, several embodiments of the present invention will be explained with reference to the accompanying drawings.

Figure 1:
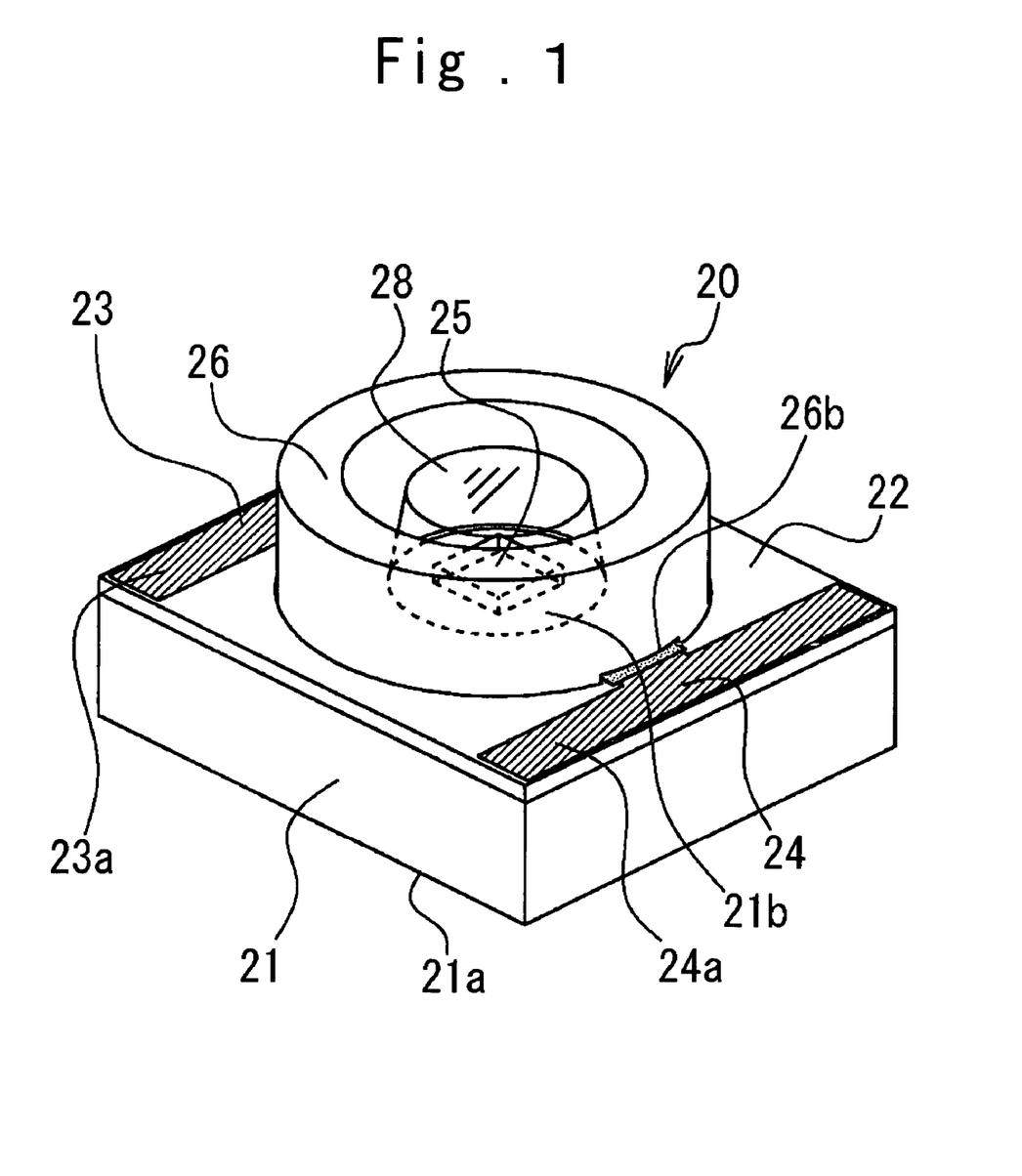
FIG. 1 is a perspective view of a surface-mounted LED in a first embodiment of the present invention.
Figure 2:
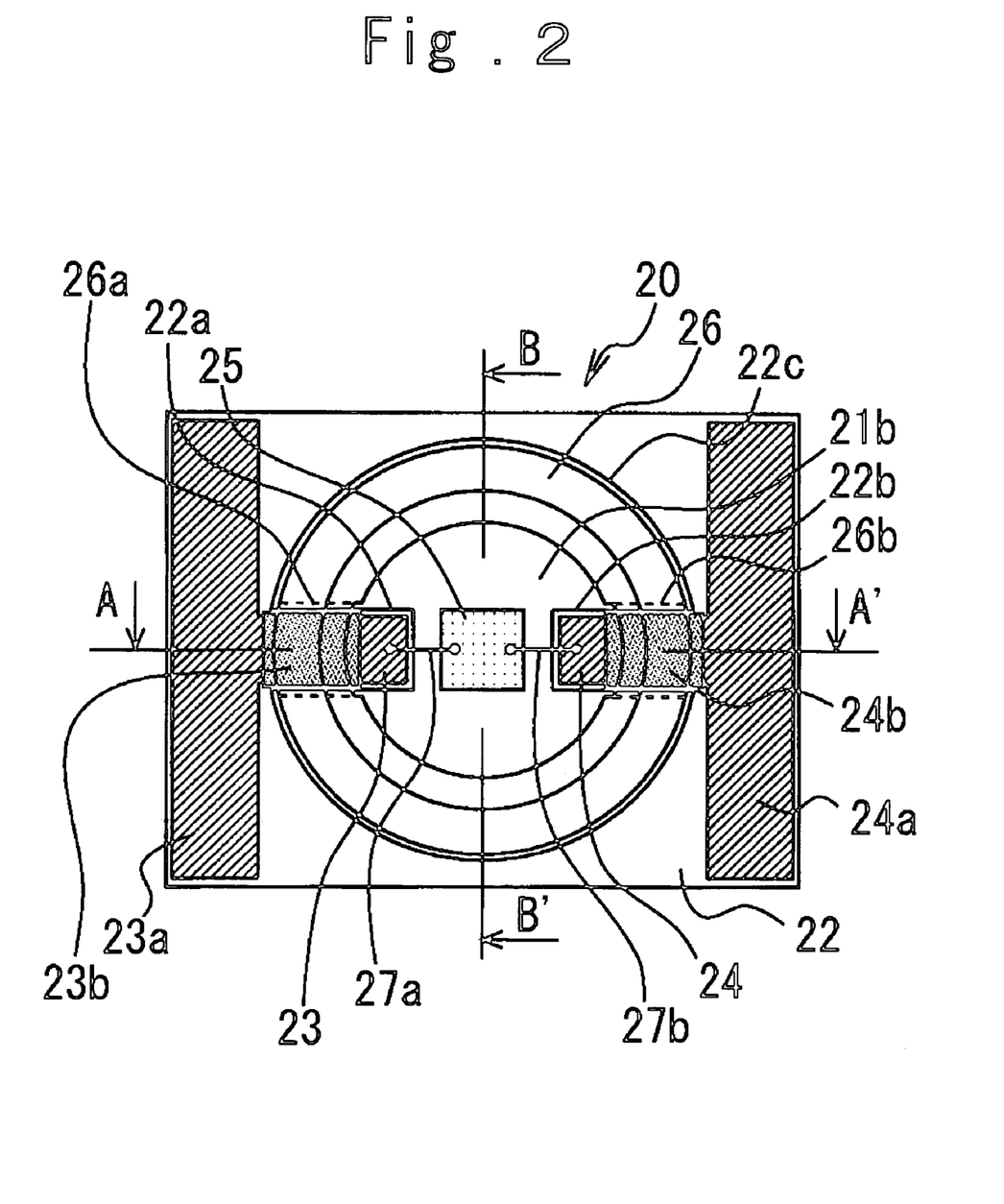
FIG. 2 is a top plan perspective view of the surface-mounted LED in the first embodiment of the present invention.

In FIGS. 1 and 2, numeral 20 is a surface-mounted LED according to the present invention, 21 a generally rectangular shaped base having heat conductivity, whose material is preferably a metal material such as copper, aluminum, or the like, having good heat conductivity. 21a is a heat releasing part positioned on a lower surface of the base 21, and the heat releasing part 21a is thermally coupled with a heat release member separate from the heat releasing part 21a, as described hereinafter.

22 is a wiring board made of glass epoxy material or the like having heat insulation, which is thermally attached on an upper surface of the base 21 through an adhesive (not shown) applied on the upper surface of the base. 23 and 24 are two conductive patterns as conductive parts which are formed into a generally T-character shape on a surface of the wiring board 22 by a copper foil or the like. The conductive patterns 23 and 24 have at end portions thereof terminal portions 23a and 24a as electrical contact surfaces, respectively, which are connected electrically and mechanically with an outside printed-circuit board as described below. Here, the terminal portions 23a and 24a are disposed oppositely to the heat releasing part 21a on a lower surface of the base 21, in this case, the base 21 and the wiring board 22 are disposed between each of the terminal portions 23a and 24a and the heat releasing part 21a.

22a and 22b are two wiring board protrusions formed on the wiring board 22, which extend into a projected state from the vicinity of the terminal portions 23a and 24a of the conductive patterns 23 and 24 to the vicinity of center of the base 21. 22c is a mounting hole, which is formed by cutting out the wiring board 22 in a generally circular shape except for the wiring board protrusions 22a and 22b. 21b is a mounting area in which a substrate surface of the base 21 is exposed by the mounting hole 22c of the wiring board 22. 25 is an LED chip as a light emitting element chip, which is mounted on the mounting area 21b of the base 21 through, preferably an adhesive member (not shown) having heat conductivity.

As a result, the LED chip 25 is directly mounted on the basic surface of the base 21 and thermally coupled with the base 21. 26 is a generally cylindrical reflective frame made of an aluminum alloy or the like having heat conductivity and a high reflection coefficient. The reflective frame 26 is disposed on an outer periphery of the mounting area 21b exposed by the mounting hole 22c of the wiring board as described above to surround the periphery of the LED chip 25, and fixed by an adhesive or the like (not shown) to couple thermally with the base 21. 26a and 26b are reflective frame concave portions formed in a line state on a lower portion of the reflective frame 26, which form a mechanical and electrical non-contact structure by avoiding the wiring board protrusions 22a, 22b and the conductive patterns 23,24 formed on the wiring board protrusions 22a, 22b. Meanwhile, the reflective frame 26 is adapted to be seen through it in FIG. 2 for convenience of explanation.

23b and 24b are insulative resistors, which cover surfaces of the conductive patterns 23 and 24 close to the reflective frame concave portions 26a and 26b of the reflective frame 26 and secure electrical insulation of the reflective frame 26 and the conductive patterns 23, 24.

27a and 27b are two wires comprising metal thin wires as electrical connecting members, which connect electrically anode and cathode terminals (not shown) of the LED chip 25 with the conductive patterns 23, 24 on the wiring board protrusions 22a, 22b. In addition, gold plating is preferably provided on the surfaces of the conductive patterns 23, 24.

28 is a generally cylindrical transparent sealing member, which covers the LED chip 25, the wires 27a, 27b, and the wiring board protrusions 22a, 22b to protect mechanically them. Note that the sealing member 28 is omitted in FIG. 2.

Next, the structure of the surface-mounted LED in the first embodiment of the present invention will be described in more detail referring to FIGS. 3 and 4.

Figure 3:
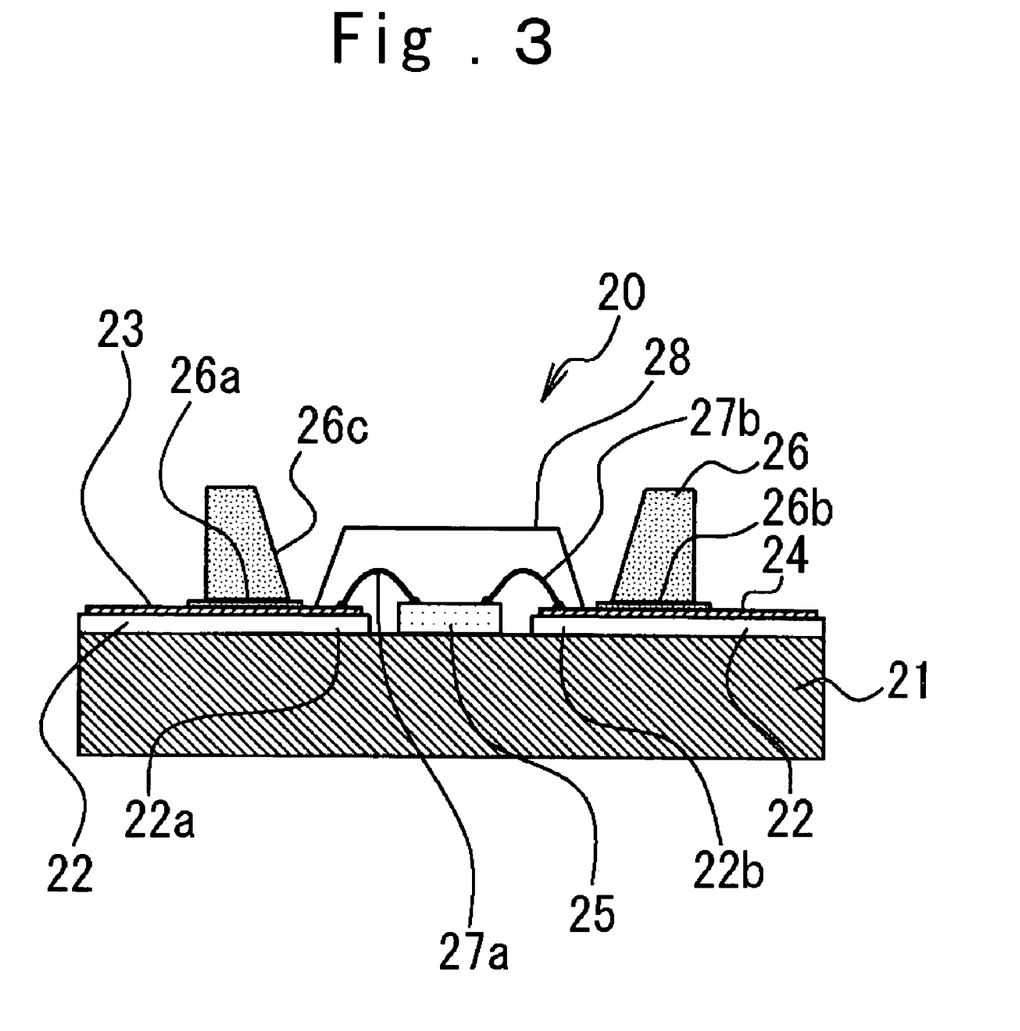
FIG. 3 is a sectional view taken along A–A' line in FIG. 2 in which the surface-mounted LED in the first embodiment of the present invention is shown.
Figure 4:
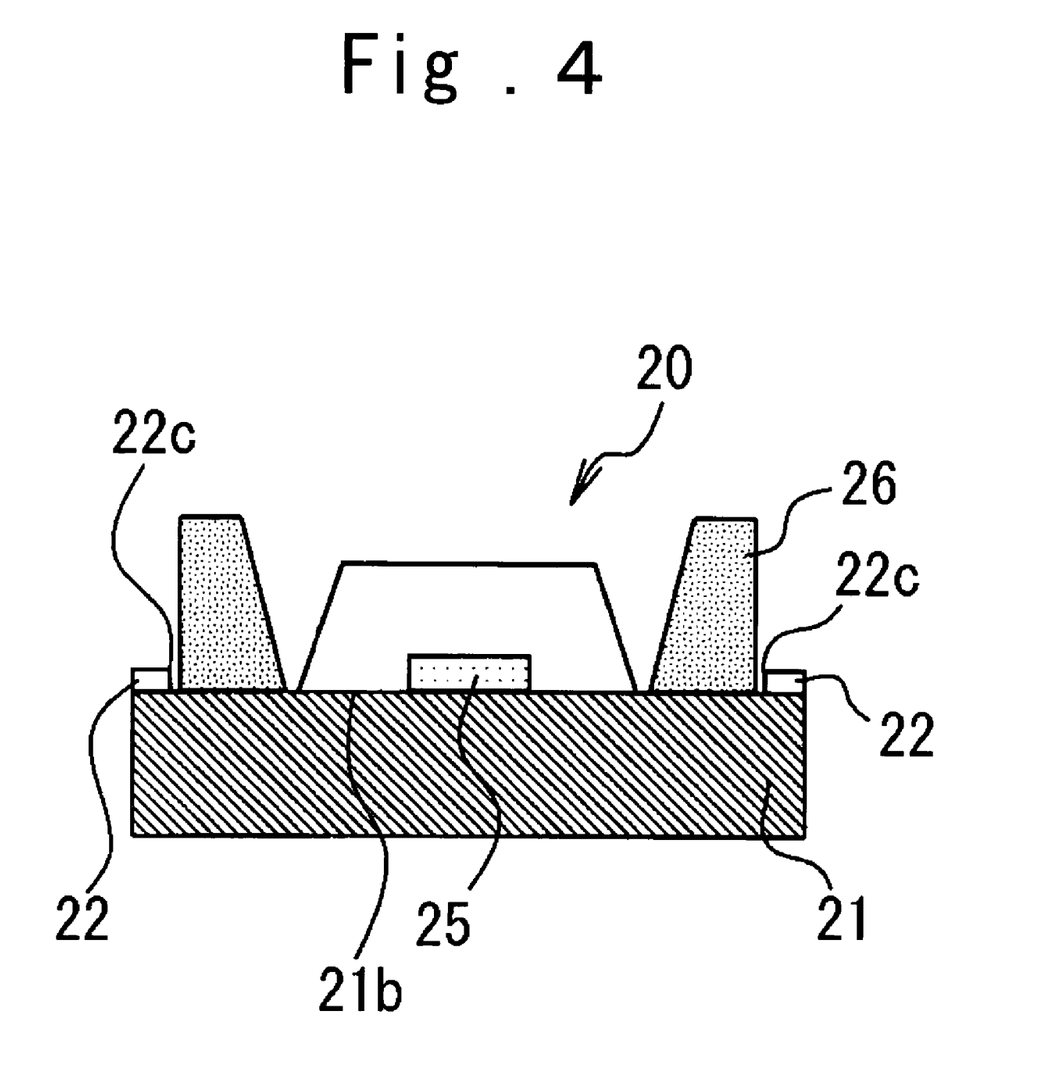
FIG. 4 is a sectional view taken along B–B' line in FIG. 2.

In FIG. 3, the wiring board protrusions 22a and 22b extend from the vicinity of opposite end portions of the wiring board 22 passing through the lower portion of the reflective frame 26 to the vicinity of the center of the base 21 and are close to the LED chip 25.

The conductive patterns 23 and 24 on the wiring board protrusions 22a, 22b are also close to the LED chip 25 passing through the lower portion of the reflective frame 26. Meanwhile, because the reflective frame 26 avoids the wiring board protrusions 22a, 22b and the conductive patterns 23, 24 by the reflective frame concave portions 26a, 26b, the disposition of the wiring board protrusions 22a, 22b and the conductive patterns 23, 24 is not blocked by the reflective frame 26.

The anode and cathode terminals (not shown) of the LED chip 25 are electrically connected with the conductive patterns 23, 24 close to the LED chip 25 by the wires 27a, 27b, as described above.

26c is a reflective surface, which is provided in an inner surface of the reflective frame 26 close to the LED chip 25 and has radially an appropriate angle to reflect light released from the LED chip 25 and to collect the reflected light. The reflective surface 26c may be structured to further enhance reflective efficiency of light by providing bright plating thereon.

Subsequently, in FIG. 4, the reflective frame 26 is fixed on the periphery of mounting area 21b of the base 21, exposed by the mounting hole 22c of the wiring board 22 cut out in the generally circular shape, as described above. As a result, because the reflective frame 26 is fixed to the base 21 with a wide area, in an area other than the reflective frame concave portions 26a, 26b, the reflective frame 26 and the base 21 are thermally coupled, with a low thermal resistance.

Next, an operation of the surface-mounted LED 20 in the first embodiment of the present invention will be explained with reference to FIGS. 1 to 4.

When a driving voltage is applied to the terminal portions 23a and 23b, a driving current flows through the wires 27a and 27b to the LED chip 25. As a result, the LED chip 25 expends a power equal to amplification of the driving voltage and the driving current and a portion of energy becomes output light, which is emitted passing through the sealing member 28, while most of energy becomes heat which is generated from the LED chip 25.

Here, because the LED chip 25 is thermally coupled through the adhesive member having the heat conductivity with the base 21, as described above, heat generated from the LED chip 25 is transmitted effectively to the base 21. The heat transmitted to the base 21 is then transmitted effectively to the reflective frame 26 thermally coupled with the base 21. Moreover, if the heat release member having a relatively large heat release capacity is closely contacted with the heat releasing part 21a disposed on the lower surface of the base 21, it is possible to realize its heat release efficiency because the heat of the base 21 is transmitted to the heat release member. A detailed description on this will be described below. Furthermore, if the heat release member is closely contacted with the reflective frame 26, further efficient heat release can be accomplished.

In addition, in this embodiment, although one LED chip is shown, the present invention is not limited to this, for example, the base 21 is formed into a slightly elongate rectangular solid, and the reflective frame 26 is also formed into a generally elliptic shape and a plurality of LED chips may be mounted longitudinally of the base. The shape of the base 21 is not limited to the rectangular solid, it may be polygonal or cylindrical. A shape of each of the wiring board 22, conductive patterns 23, 24, the reflective frame 26 and so on is also not limited to the first embodiment, if functions thereof are satisfied, they can be formed into any shapes.

As described above, according to the first embodiment of the present invention, because heat from the LED chip 25 can be released through both the heat conductive base 21 and the heat conductive reflective frame 26 thermally coupled with the base 21, the surface-mounted LED of a high heat release efficiency can be accomplished. Because the reflective surface 26c is formed on the inner surface of the reflective frame 26 to reflect and collect light efficiently from the LED chip 25, the surface-mounted LED having a high efficiency for emitting light can be accomplished.

Moreover, because the heat releasing part 21a positioned on the lower surface of the base 21 and the terminal portions 23a, 24a for connecting with the outside printed-circuit board are oppositely disposed, a heat release route from the LED chip 25 and a current supplying route to the LED chip 25 can be separated, a degree of freedom is increased to a heat release design and further a material of the substrate on which the surface-mounted LED is mounted is not limited.

Also, the surface mounting of the surface-mounted LED can be mounted on the printed-circuit board, it is possible to correspond to efficiency of mounting operation and reduction of mounting area and so on.

Next, a second embodiment of the present invention will be explained referring to FIGS. 5 and 6.

In the drawings, the same numerals are attached to the similar parts as in the first embodiment in FIG. 1 and the overlapped description is omitted.

Figure 5:
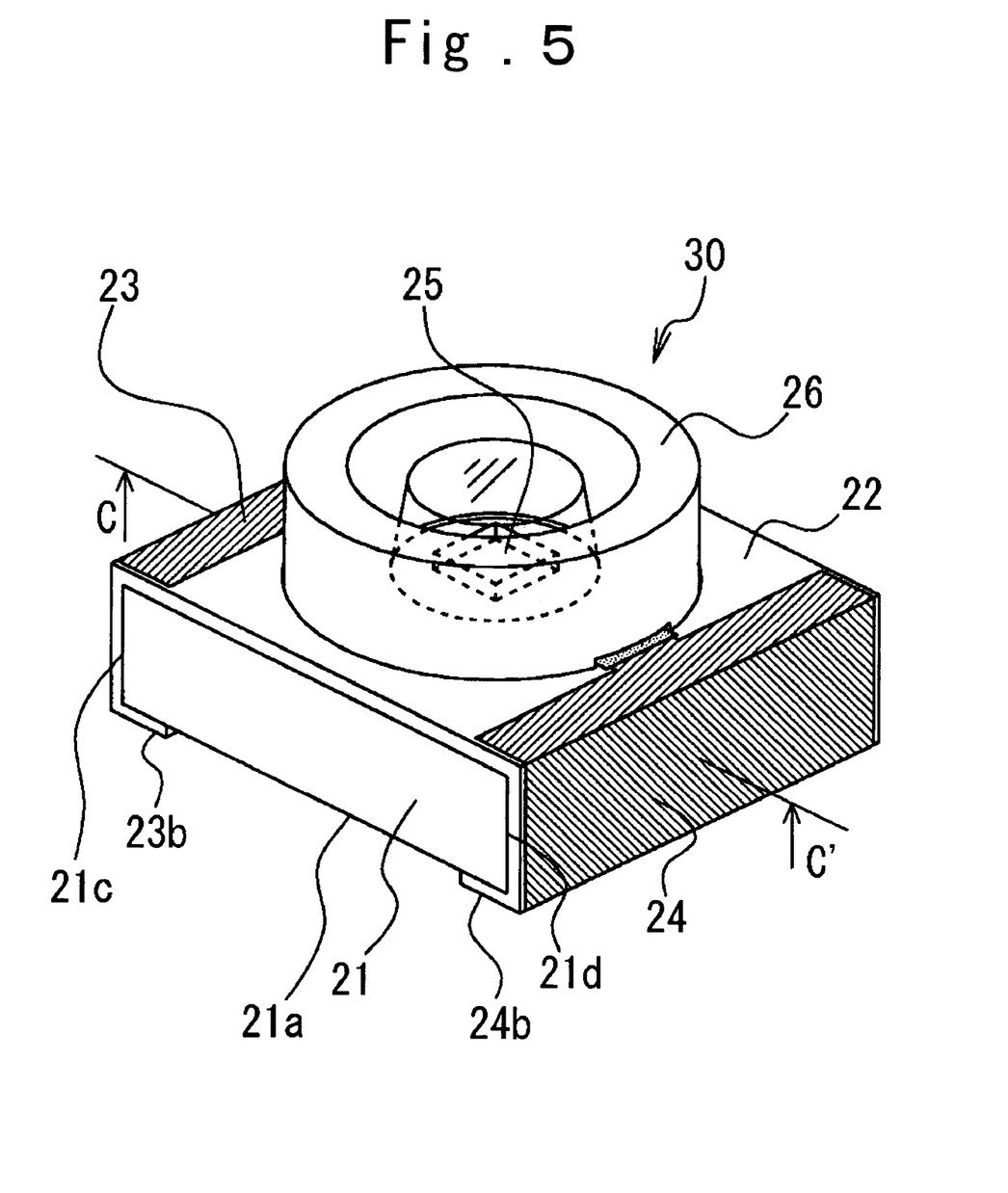
FIG. 5 is a perspective view showing a surface-mounted LED in a second embodiment of the present invention.
Figure 6:
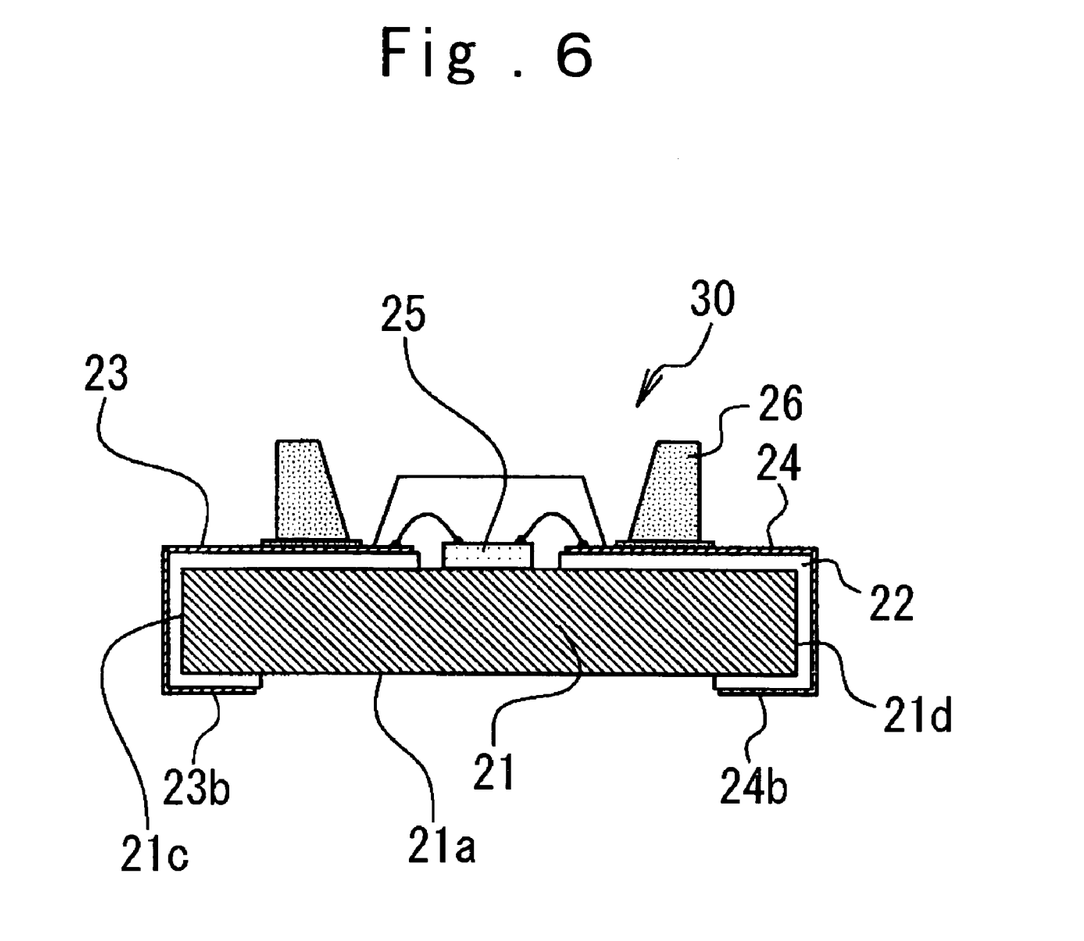
FIG. 6 is a sectional view taken along C–C' line in FIG. 5 in which the surface-mounted LED in the second embodiment is shown.

In FIGS. 5 and 6, 30 is a surface-mounted LED in the second embodiment of the present invention.

The wiring board 22 is disposed to run around the heat releasing part 21a on the lower surface of the base 21 from both end surfaces 21c and 21d of the base 21. The conductive patterns 23 and 24 formed on the wiring board 22 are also disposed to run around the wiring board 22 and therefore terminal portions 23b and 24b as electrical connection surfaces are formed on the lower surface of the base 21. As a result, the terminal portions 23b and 24b are connected electrically and mechanically with the outside printed-circuit board by the surface-mounting, as described hereinafter, to enable a driving current to supply to the LED chip 25 by means of the terminal portions 23b and 24b. As described below, heat generated from the LED chip 25 can be released through the heat release member closely contacting with the reflective frame 26.

As described above, according to the second embodiment of the present invention, because the heat release route from the LED chip 25 is secured by the reflective frame 26 and the current supplying route to the LED chip 25 is secured by the terminal portions 23b and 24b disposed on the lower surface of the base 21, it is possible to provide the surface-mounted LED in which heat release is efficiently performed, the optimum for surface-mounting LED is accomplished, and a material for the substrate or board to mount the LED is not limited.

Subsequently, a third embodiment of the present invention will be explained referring to FIG. 7.

Figure 7:
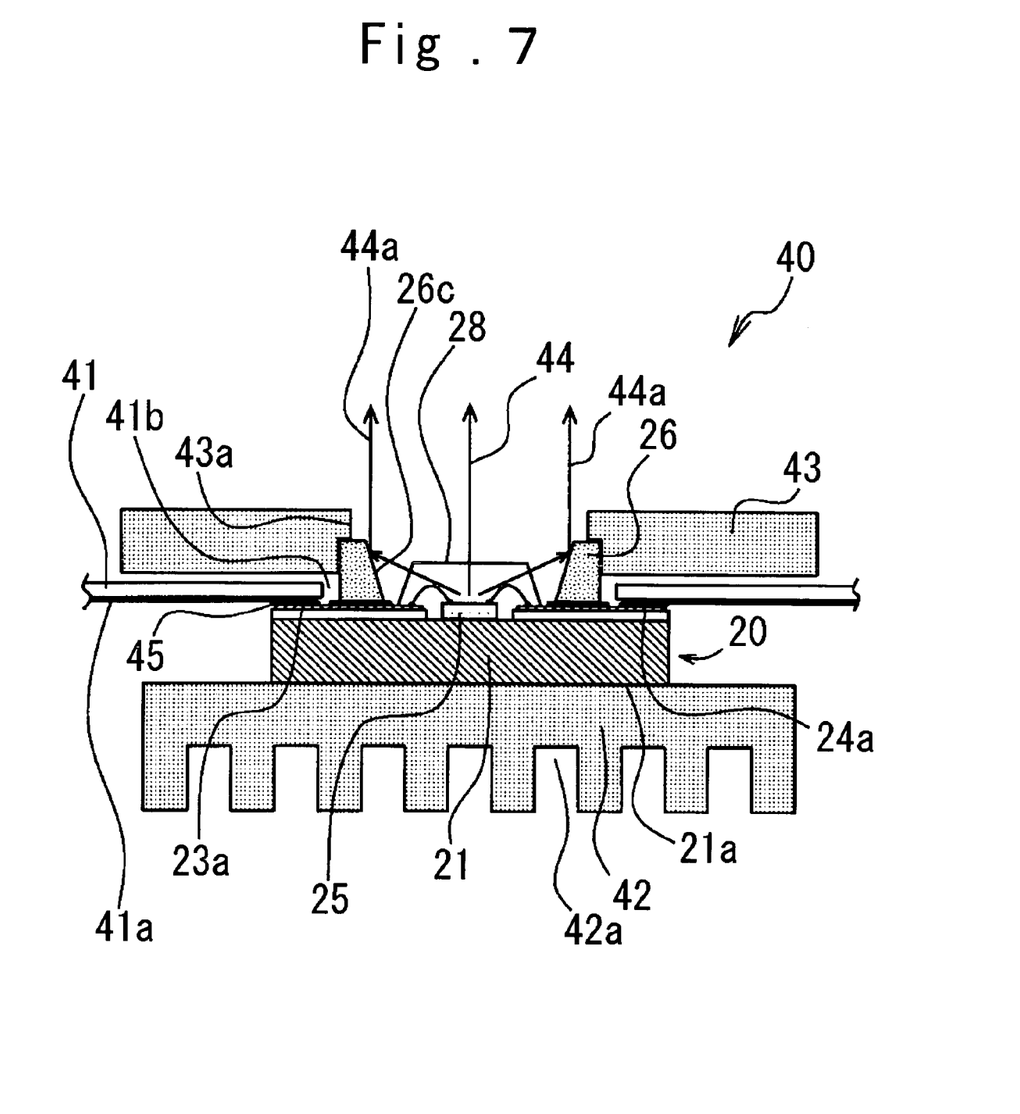
FIG. 7 is a sectional view showing a light emitting device in a third embodiment of the present invention.

In FIG. 7, the same numerals are attached to the similar parts as in the first embodiment of the present invention and the overlapped description is partially omitted.

In FIG. 7, 40 is a light emitting device according to the present invention, which is composed of the surface-mounted LED 20, a printed-circuit board 41 as a substrate and two heat release members 42 and 43 each made of a material having heat conductivity.

The printed-circuit board 41 has conductive patterns 41a each comprising a copper foil or the like and a mounting hole 41b which is generally circular. Here, the surface-mounted LED 20 is disposed to be fitted in the mounting hole 41b of the printed-circuit board 41, and the terminal portions 23a and 24a of the surface-mounted LED 20 and the conductive patterns 41a of the printed-circuit board 41 are electrically and mechanically connected by soldering 45 as connecting means.

A heat release member 42 is fixed to and thermally coupled with the heat releasing part 21a of the base 21 in the surface-mounted LED 20. 42a are a plurality of heat release concave portions which are arranged in a line state and which are disposed on a lower surface of the heat release member 42 and act to enlarge a surface area of the heat release member 42 and to enhance a heat release efficiency. The heat release member 43 also has a heat release hole 43a in which a peripheral portion of the reflective frame 26 of the surface-mounted LED 20 is fitted, to be fixed to the reflective frame 26 and be thermally coupled.

Next, an operation of the light emitting device 40 will be explained.

When a driving voltage is applied to the terminal portions 23a and 24a of the surface-mounted LED 20 through the conductive patterns 41a of the printed-circuit board 41, a driving current flows into the LED chip 25 to drive it and light 44 emitted from the LED chip passes through the sealing member 28 and is released from the heat release hole 43a of the heat release member 43. Scattered light 44a, which is one portion of the emitted light 44 and is emitted obliquely from the LED chip 25 is reflected on the reflective surface 26c of the reflective frame 26 and collected and emitted in a generally equal vertical direction with the emitted light 44 to become a strong light having a directivity.

Heat generated from the LED chip 25 is transmitted to the base 21 as a first heat release route, further is transmitted from the heat releasing part 21a of the base 21 to the heat release member 43 and then is released to an ambient layer of air and so on. As a second heat release route, heat from the LED chip 25 is transmitted from the base 21 to the reflective frame 26, further is transmitted to the heat release member 43 and then released to the ambient air layer and so on.

As described above, according to the third embodiment of the present invention, the two heat release members 42 and 43 are disposed to sandwich the surface-mounted LED 20 and heat from the LED chip 25 is transmitted efficiently to the two heat release members 42 and 43 and then is released to the ambient layer of air and so on. As a result, an increment of temperature of the LED chip 25 is maintained to the minimum, accordingly it is possible to provide the light emitting device suitable for high brightness and high output applications, configured to resist sufficiently to a high-current drive.

Because the increment of temperature of the LED chip 25 is kept low, it is possible to prevent heat deterioration of a junction of the LED chip 25 and lower luminance by the change of the sealing member 28 in color or the like due to heat and thus it is possible to accomplish the light emitting device having high reliability and a long life.

Because the scattered light 44a from the LED chip 25 is reflected on and concentrated by the reflective surface 26c of the reflective frame 26, the light emitting device having an improved characteristic of concentration and a preferable directivity can be accomplished. Moreover, if the bright plating is provided on the reflective surface 26c, as described above, reflectivity of the reflective surface 26c is further enhanced so that the light emitting device having higher output can be achieved.

Furthermore, because the terminal portions 23a and 24a of the surface-mounted LED 20 are provided on a surface of the base 21 opposite to the heat releasing part 21a, the printed-circuit board 41 connected with the terminal portions 23a and 24a is disposed in a remote position opposing to the heat releasing part 21a of the base 21, as a result, the printed-circuit board 41 has no role for releasing heat from the LED chip 25. Consequently, it is not required to use a high cost material such as a high conductive metal core substrate or the like for the printed-circuit board 41, because glass epoxy material or the like can be used, as a usual printed-circuit board, it is possible to have a high degree of freedom to selection of the substrate material and to accomplish cost down of the light emitting device.

Meanwhile, the heat release member 42 has the heat release concave portions 42a to have more efficient heat release effect, but the heat release member is not limited to the structure, the heat release concave portions 42a may not be required. Contrary, although the heat release concave portions 42 are not provided on the heat release member 43 as shown in FIG. 7, they may be provided on the heat release member 43 in order to have more efficient heat release effect.

In addition, the light emitting device may be adapted to include a case structure in which the heat release members 42 and 43 are integrally formed to cover the surface-mounted LED chip 20 and has mechanical protection function. Furthermore, if it is not necessary to supply a high power to the LED chip 25, either one of the heat release members 42 and 43 can be omitted.

Next, a light emitting device in a fourth embodiment of the present invention will be explained referring to FIG. 8.

Figure 8:
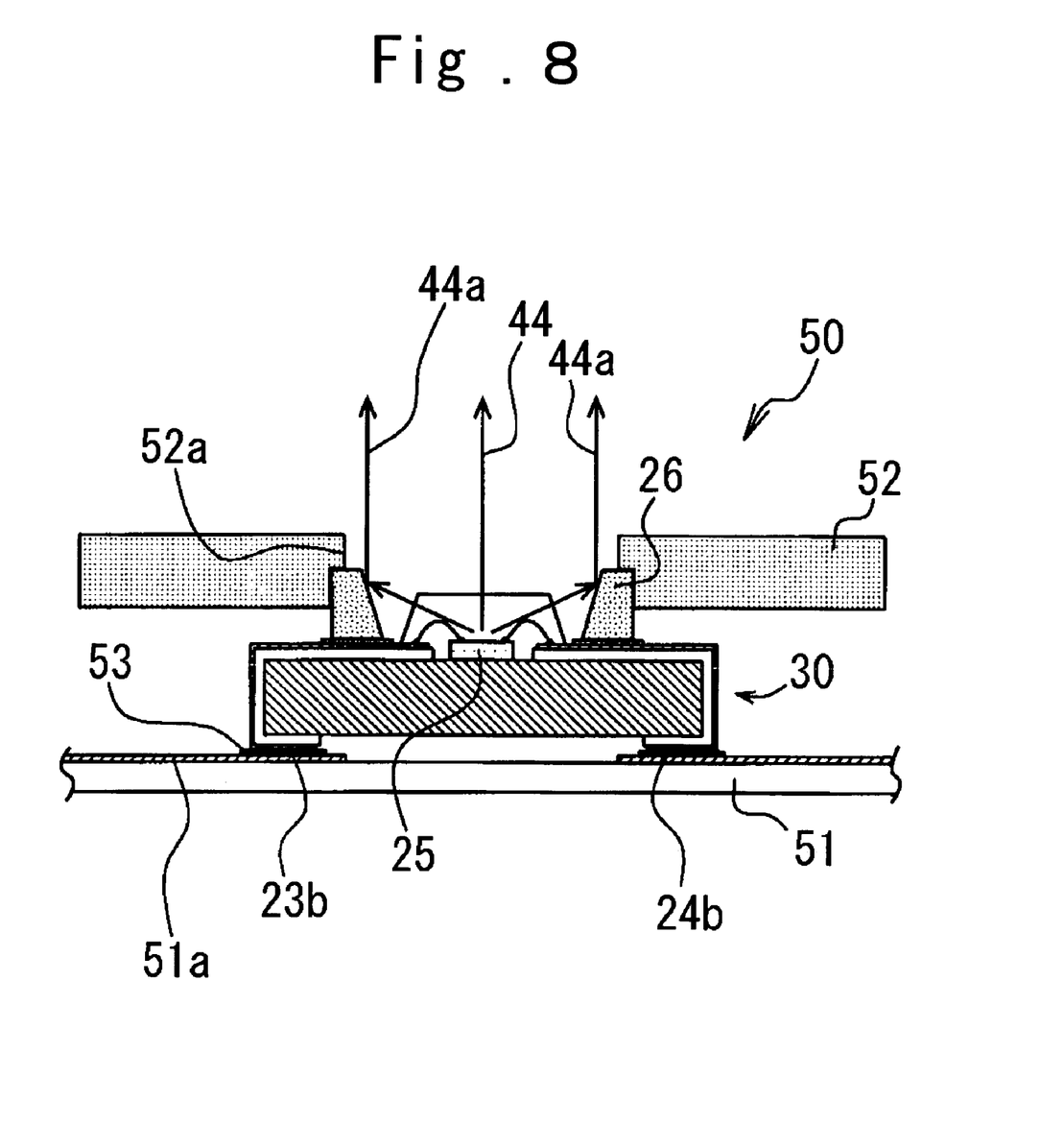
FIG. 8 is a sectional view showing a light emitting device in a fourth embodiment of the present invention.

In FIG. 8, the same numerals are attached to the similar parts as in the second embodiment of the present invention, the overlapped descriptions are partially omitted.

In FIG. 8, 50 is the light emitting device, which is composed of the surface-mounted LED 30 shown in the second embodiment, a printed-circuit board as a substrate, and a heat release member 52 of a material having heat conductivity.

The printed-circuit board 51 has conductive patterns 51a formed from copper foils or the like, and the terminal portions 23b and 24b provided on the lower surface of the surface-mounted LED 30 are connected electrically and mechanically with the conductive patterns 51a of the printed-circuit board 51 by soldering 53 as connection means. The heat release member 52 has a heat release hole 52a into which the peripheral portion of the reflective frame 26 in the surface-mounted LED 30 is fitted, and is fixed to and thermally coupled with the reflective frame 26.

Subsequently, an operation of the light emitting device 50 will be explained.

When a driving voltage is applied through the conductive patterns 51a of the printed-circuit board 51 to the terminals portions 23b and 24b of the surface-mounted LED 30, a driving current flows through the LED chip 25 to drive it. Hereinafter, because an operation of the emitted light 44 from the LED chip 25 and the scattered light 44a is the same as that of the third embodiment, the description is omitted.

Heat in the LED chip 25 is transmitted from the base 21 to reflective frame 26, further is transmitted to the heat release member 52 fitting with the peripheral portion of reflective frame 26 to thermally couple, and then is released to the ambient air layer and so on.

As described above, according to the fourth embodiment of the present invention, because the heat from the LED chip 25 is efficiently transmitted through the reflective frame 26 to the heat release member 52 and is released to the ambient air layer, the increment of temperature of the LED chip 25 is kept to the minimum. As a result, it is possible to provide the light emitting device which is resisted to the high current drive and is suitable for the high brightness and high output applications. In the fourth embodiment, because the heat release member is one, in comparison with the third embodiment shown in FIG. 7, the heat release efficiency slightly drops, while further miniaturized and thinned light emitting device can be provided. Moreover, because the surface-mounted LED can be mounted on the upper surface of the printed-circuit board 51, a mounting work is simple and mass-productivity is excellent.

Furthermore, because the printed-circuit board 51 has no role of releasing heat generated from the LED chip 25, it is not necessary to use an expensive material such as the metal core substrate having good heat conductivity, it is possible to use the usual printed-circuit board of the glass epoxy resin material or the like and therefore to have the high degree of freedom to selection of the substrate material. In addition, because a flexible printed-circuit board can be used for the printed-circuit board 51, a plurality of surface-mounted LEDs are mounted in various directions and therefore a light emitting device having a high degree of freedom such as diffusion or collection of emitted light can be accomplished.

Meanwhile, in the surface-mounted LED of the present invention, a light scattering material, fluorescent particles, a dimmer material or the like can be included in the sealing member and so on for covering the LED chip. Consequently, a various of surface-mounted LEDs, in which directivity of emitted light and light emitting wave frequency are different, and a light emitting device for using each thereof can be provided. It is also possible to set finely the directivity of the emitted light by changing a height of the reflective frame 26, and an angle or a shape of the reflective surface 26c provided in the inner surface of the reflective frame 26.

As is clear from the above, the surface-mounted LED and the light emitting device for using it, according to the present invention cause heat from the light emitting element chip to release by means of both the heat conductive base and the heat conductive reflective frame fixed directly to the base, and therefore the surface-mounted LED having a heat release efficiency can be realized. Moreover, because the reflective surface is provided in the inner surface of the reflective frame to reflect and collect efficiently the emitted light from the LED chip, it is possible to provide the surface-mounted LED in which light emitting efficiency is excellent.

Although the preferred embodiments of the present invention have been described, the present invention is not limited to these embodiments, various modifications and changes can be made to the embodiments.

What is claimed is:

1. A surface-mounted LED, comprising:
    a base having heat conductivity;
    an insulative wiring board fixed to said base and including conductive patterns and a mounting hole;
    a light emitting element chip mounted on the base directly inside the mounting hole of the wiring board; and
    a sealing member for sealing the light emitting element chip; and
    a reflective frame having heat conductivity and fixed to the base within the mounting hole of the wiring board to surround the sealing member,
    wherein the reflective frame is disposed separately from the sealing member, and
    wherein heat generation from the light emitting element chip is released through both the base and the reflective frame.

2. The surface-mounted LED according to claim 1, wherein said light emitting element chip is connected with the conductive patterns of the wiring board through electrical connection members, and
    wherein the conductive patterns include at ends thereof a plurality of electrical connection surfaces comprising terminal portions to supply a driving current for driving the light emitting element chip.

3. The surface-mounted LED according to claim 2, wherein the base is configured to release heat generated from the light emitting element chip to an outer surface of the base, and
    wherein electrical connection surfaces are disposed on an upper surface of the base.

4. The surface-mounted LED according to claim 2, wherein said wiring board is disposed to extend from an upper surface and around both ends of the base to one portion of the lower surface of the base, and wherein the electrical connection surfaces comprising the terminal portions are disposed to extend from an upper surface and around both ends of the base to a lower surface of the base.

5. The surface-mounted LED according to claim 1, wherein an inner surface of the reflective frame adjacent to the light emitting element chip includes a reflective surface to reflect light emitted from the light emitting element chip.

6. The surface-mounted LED according to claim 5, wherein a bright plating is provided on the reflective surface of the reflective frame.

7. A light emitting device, comprising:

the surface-mounted LED according to any one of claims 1 to 6; further comprising a printed-circuit board including conductive patterns, wherein said conductive patterns of the printed-circuit board and electrical connection surfaces provided on the surface-mounted LED being connected mechanically and electrically by a fixing structure.

8. The light emitting device according to claim 7, further comprising a heat release member having heat conductivity, wherein said heat release member is fixed and thermally coupled with a peripheral portion of the reflective frame of the surface-mounted LED so that heat generated from the surface-mounted LED is released through the reflective frame and the heat release member.

9. The light emitting device according to claim 7, further comprising a heat release member having heat conductivity, wherein the base includes a heat releasing part, wherein said heat release member is fixed and thermally coupled with the heat releasing part of the base of the surface-mounted LED so that heat generated from the surface-mounted LED is released through the heat releasing part of the base and the heat release member.

10. The light emitting device according to claim 7, further comprising a first heat release member and a second heat release member which have heat conductivity, wherein the base includes a heat releasing part, wherein said first heat release member is fixed and thermally coupled with a peripheral portion of the reflective frame of the surface-mounted LED and said second heat release member is fixed and thermally coupled with the heat releasing part of the base of the surface-mounted LED so that heat generated from the surface-mounted LED is released through both the first heat release member and the second heat release member.

* * * * *